United States Patent
Kropp et al.

(10) Patent No.: US 9,917,419 B2
(45) Date of Patent: Mar. 13, 2018

(54) LOW CAPACITANCE OPTOELECTRONIC DEVICE

(71) Applicant: VI Systems GmbH, Berlin (DE)

(72) Inventors: Joerg-Reinhardt Kropp, Berlin (DE); Nikolay Ledentsov, Berlin (DE); Vitaly Shchukin, Berlin (DE)

(73) Assignee: VI Systems GmbH, Berlin (DE)

( * ) Notice: Subject to any disclaimer, the term of this patent is extended or adjusted under 35 U.S.C. 154(b) by 0 days.

(21) Appl. No.: 15/193,069

(22) Filed: Jun. 26, 2016

(65) Prior Publication Data

US 2017/0373471 A1    Dec. 28, 2017

(51) Int. Cl.
| | |
|---|---|
| *H01S 5/00* | (2006.01) |
| *H01S 5/183* | (2006.01) |
| *H01S 5/22* | (2006.01) |
| *H01S 5/30* | (2006.01) |
| *H01S 5/02* | (2006.01) |
| *H01S 5/187* | (2006.01) |
| *H01S 5/042* | (2006.01) |
| *H01S 5/32* | (2006.01) |

(52) U.S. Cl.
CPC ........ *H01S 5/18316* (2013.01); *H01S 5/0208* (2013.01); *H01S 5/0421* (2013.01); *H01S 5/183* (2013.01); *H01S 5/187* (2013.01); *H01S 5/18308* (2013.01); *H01S 5/18313* (2013.01); *H01S 5/18327* (2013.01); *H01S 5/2202* (2013.01); *H01S 5/2214* (2013.01); *H01S 5/305* (2013.01); *H01S 5/3054* (2013.01); *H01S 5/32* (2013.01)

(58) Field of Classification Search
CPC ............. H01S 5/18316; H01S 5/18327; H01S 5/18313; H01S 5/18308; H01S 5/187; H01S 5/183; H01S 5/2214; H01S 5/0208; H01S 5/0421; H01S 5/2202; H01S 5/3054
See application file for complete search history.

(56) References Cited

U.S. PATENT DOCUMENTS

| | | | | |
|---|---|---|---|---|
| 5,822,349 | A | * | 10/1998 | Takaoka ................ H01S 5/227 372/46.01 |
| 6,127,695 | A | * | 10/2000 | Harris ................ H01L 29/1608 257/343 |

(Continued)

*Primary Examiner* — Kinam Park
(74) *Attorney, Agent, or Firm* — Gordon Rees Scully Mansukhani, LLP

(57) ABSTRACT

An optoelectronic semiconductor device is disclosed wherein the device is a vertical-cavity surface-emitting laser or a photodiode containing a section, the top part of which is electrically isolated from the rest of the device. The electric isolation can be realized by etching a set of holes and selective oxidation of AlGaAs layer or layers such that the oxide forms a continuous layer or layers everywhere beneath the top surface of this section. Alternatively, a device can be grown epitaxially on a semi-insulating substrate, and a round trench around a section of the device can be etched down to the semi-insulating substrate thus isolating this section electrically from the rest of the device. Then if top contact pads are deposited on top of the electrically isolated section, the pads have a low capacitance, and a pad capacitance below two hundred femto-Farads, and the total capacitance of the device below three hundred femto-Farads can be reached.

10 Claims, 8 Drawing Sheets

(56) References Cited

U.S. PATENT DOCUMENTS 6,239,354 B1 * 5/2001 Wanlass ................ H01L 27/142
                                                    136/244
6,658,040 B1 * 12/2003 Hu ....................... H01S 5/18311
                                                    372/96

* cited by examiner

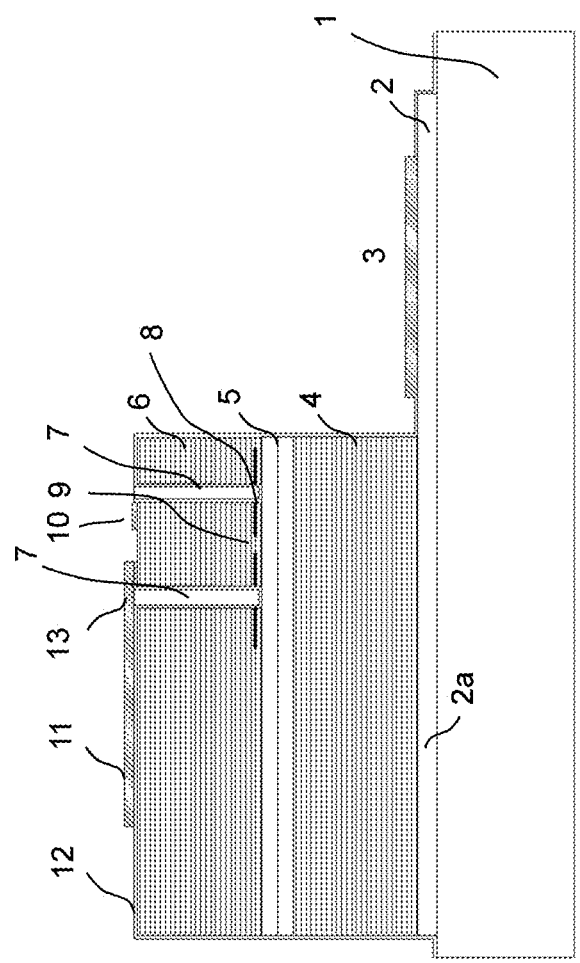
Fig. 1: Prior Art

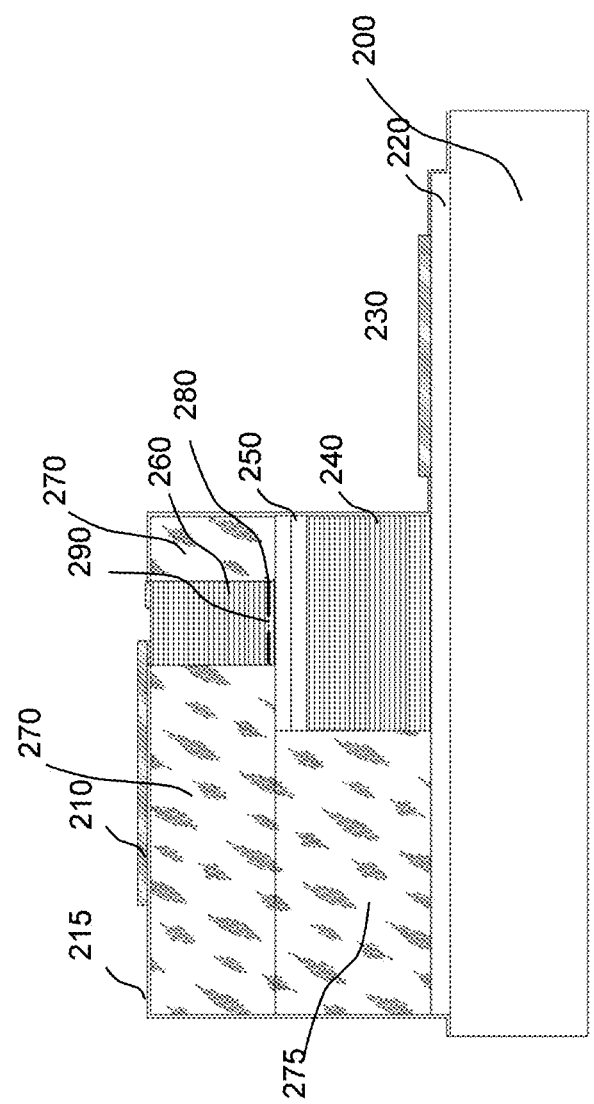
Fig. 2: Prior Art

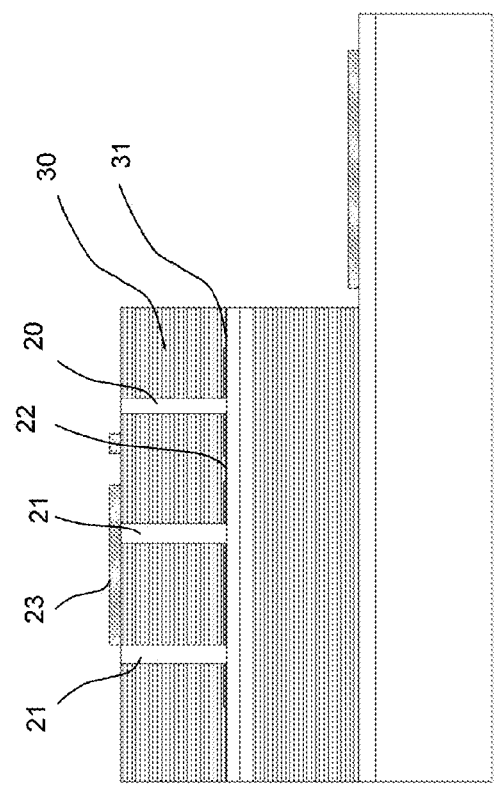
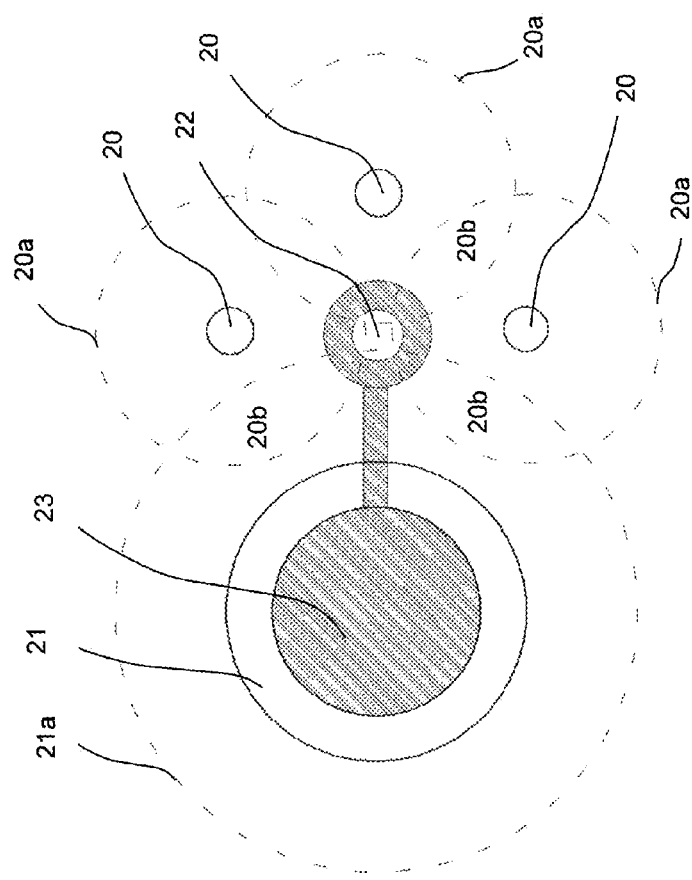
Fig. 3b
Fig. 3a

LOW CAPACITANCE OPTOELECTRONIC DEVICE

REFERENCE TO RELATED APPLICATIONS

This application claims an invention, which was disclosed in Provisional Application No. 62/186,279, filed Jun. 29, 2015, entitled "Low Capacitance Vertical-Cavity Surface-Emitting Laser". The benefit under 35 USC § 119(e) of the United States provisional application is hereby claimed, and the aforementioned application is hereby incorporated herein by reference.

BACKGROUND OF THE INVENTION

Field of the Invention

The invention pertains to the field of optoelectronic devices. More particularly, the invention pertains to vertical-cavity surface-emitting lasers and photodiodes.

Description of Related Art

Very fast optoelectronic devices are key components of the high-speed optical communication in High Power Computers, data centers, routers and all kinds of networks. It is necessary to apply for optical fiber connections very fast edge emitting lasers as well as Vertical Cavity Surface Emitting Lasers (VCSEL) as transmitters and very fast photodiodes as receivers. Further, VCSELs have a broad area of applications covering sensing, gesture recognition, illumination and display applications. VCSELs and high speed pin-photodiodes are key components for optical interconnects and are widely applied in high performance computers and data centers. The development of high-speed data transmission systems according to the Roadmap of the Institute of Electrical and Electronics Engineers (IEEE) is accompanied by a doubling of the bit rate via core networking every 18 months, having reached in the year 2015 100 Gb/s per channel.

The major factor limiting the high-speed performance of the VCSELs as well as photodiodes is the parasitic capacitance. Various approaches are being used to reduce the device capacitance. First, selective oxidation is applied, wherein (Ga)AlAs layers with a high Al content are transformed into amorphous dielectric layers (Ga)AlO$_x$. The oxide layers, on the one hand, form apertures defining the path of the electric current and preventing generation of light beneath the top contact. On the other hand, thick dielectric oxide layers reduce the capacitance. Second, planarization of a device by a soft dielectric material, e. g., benzocyclobutene (BCB) or polyimide is used. Third, the devices with a low capacitance require epitaxial growth on a semi-insulating substrate and making a contact to the bottom distributed Bragg reflector (DBR) from the top through a trench etched down to a doped buffer layer grown on a semi-insulating substrate, wherein both contact pads are formed on the same level on top of the device.

Typical aperture diameter of fast VCSELs is ranging from 4 to 10 micrometers. The aperture capacitance can be reduced due to multiple oxide-confined apertures. It can be made below 150 femto-Farads down to 90 femto-Farads. However, contact pads introduce additional capacitance. The pad capacitance can be reduced, e. g., by using a soft dielectric for planarization. This approach requires rather complex processing whereas such dielectric is often fragile, also showing a poor adhesion to the semiconductor material resulting in lift-off of the contact pads once bonding is attempted.

FIG. 1 illustrates schematically a prior art VCSEL. The VCSEL consists of an optical cavity (5) places between a bottom distributed Bragg reflector (DBR) (4) and a top DBR (6). The structure is grown epitaxially on a substrate (1). The growth typically begins with a buffer layer (2). A trench (7), typically a round trench is etched around the mesa.

One or several AlGaAs layers with a high Al content are exposed to the air at the side walls of the trench (7). Upon oxidation, oxide layers are formed at the side walls. These oxide layers (8) confine the semiconductor aperture (9) through which the injection current flows to the gain medium and through which the generated light is emitted out of the device. Top contact to the device is typically made such that a top contact metal ring (10) is deposited on top of the mesa, a large contact pad (11) is deposited on top of the top DBR outside of the mesa (12), and an air bridge (13) is made connecting a metal contact ring and a contact pad. In this case the top contact pad (11) having an area significantly exceeding the mesa area is formed opposite to the same large area of the bottom DBR, buffer layer and substrate. Even if the substrate (1) is semi-insulating, and a bottom contact (3) is made not to the back side of the substrate, but to the buffer layer (2), the buffer layer (2) opposite to the top metal contact pad is charged. Thus, if the buffer layer (2) and the bottom DBR (4) are n-doped, the top DBR (6) is p-doped, and the top contact is a p-contact (11) a large capacitance occurs between the p top contact pad (11) and the section of the n-doped buffer layer opposite to the top contact pad (2a). Such an approach does not enable fabricating low capacitance VCSELs.

A surface-emitting laser is described in the U.S. patent entitled "Near planar native-oxide VCSEL devices and arrays using converging oxide ringlets" by Corzine et al, issued 20 Apr. 1999, U.S. Pat. No. 5,896,408, which uses converging oxide ringlets from holes to form the oxide layer and to define the open aperture of the VCSEL as a non-oxidized area. Even there electrically conductive p- and n-doped DBR layers are used and since the device has a near planar surface a large capacitance occurs once a contact pad is applied on the top surface. Thus Corzine et al. neither targets nor teaches fabricating a low capacitance VCSEL.

FIG. 2 illustrates the state of the art of a fast and low capacity VCSEL device. The device consists of the top DBR (260) and the bottom DBR (240) with the active area (250) in between. The top mesa that is basically formed of the top DBR (260) is etched with one diameter and the bottom DBR (240) is etched down to the n-contact layer (220) with a larger diameter. The oxide aperture (280) is in the top mesa and is defining the active diameter of the VCSEL (290). The structure is planarized by a thick layer of organic dielectric like polyimide or BCB (270, 275) such that the surface of the top mesa and the organics have about the same height. The contact pad (210) is located directly on the thick organic dielectric or on an additional thin dielectric material (215). Since the organic dielectric layer (270, 275) is very thick of the order of 3 μm to 10 μm there is a very low electrical capacitance of the contact pad (210). Such a design has several critical issues in the production. There are adhesion problems of the organic dielectric layer on the semiconductor as well as of other layers like metal on top of the organic dielectric layer which may result in delamination in bonding technology as well as weakness in long term stability.

Therefore, developing a robust technology for VCSELs with a low capacitance preferably below 300 femto-Farads is highly needed in the art.

SUMMARY OF THE INVENTION

An optoelectronic semiconductor device is disclosed wherein the device is a vertical-cavity surface-emitting laser or a photodiode containing a section, the top part of which is electrically isolated from the rest of the device. The electric isolation can be realized by etching a set of holes and selective oxidation of AlGaAs layer or layers such that the oxide forms a continuous layer or layers everywhere beneath the top surface of this section. Alternatively, a device can be grown epitaxially on a semi-insulating substrate, and a round trench around a section of the device can be etched down to the semi-insulating substrate thus isolating this section electrically from the rest of the device. Then if top contact pads are deposited on top of the electrically isolated section, the pads have a low capacitance, and a pad capacitance below two hundred femto-Farads, and the total capacitance of the device below three hundred femto-Farads can be reached.

BRIEF DESCRIPTION OF THE DRAWINGS

FIG. 1 Schematic vertical cross-section of a prior art vertical-cavity surface-emitting laser.

FIG. 2 Schematic vertical cross-section of a prior art of a fast VCSEL

FIG. 3a. Schematic top view of a device according to an embodiment of the present invention.

FIG. 3b. Schematic vertical cross-section view of the device according to the same embodiment of the present invention depicting etched holes filled by a dielectric, overlapping oxidized regions generated by the oxidation starting from the neighboring holes, and a non-oxidized aperture region.

DETAILED DESCRIPTION OF THE INVENTION

Figure 4:
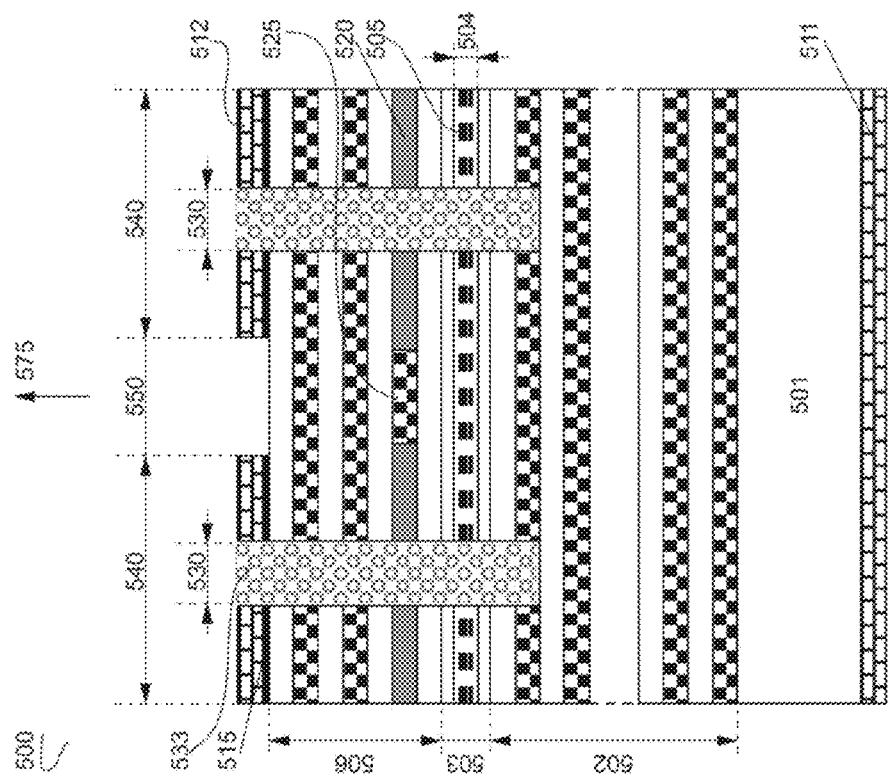
FIG. 4. Detailed schematic vertical cross-section of the device according to the same embodiment of the present invention shown also in FIGS. 3a and 3b.

FIGS. 3a and 3b illustrate schematically one embodiment of the present invention. Holes (20) or trenches (21) are etched through the top DBR (30) of a VCSEL. It is even possible to etch further through the p-n junction of a VCSEL. The etching is performed through one or several layers of AlGaAs (31) with a high Aluminum content which are subject to selective oxidation. The oxidation process starts from the etched holes and results in the formation of the oxide layer or oxide layers with a certain extension around the holes or trenches (20a, 21a). The positions of the holes, the shape of the holes and the distance between the holes as well as the extension of oxidation are preferably selected such that the oxide areas generated by neighboring holes overlap (20b) and leaving only some small non-oxidized areas in between (22). These non-oxidized areas will form the apertures for the current flow and for the propagation of light. One may define the oxidized section of the device by projecting the oxide layers on the top surface. One should note that the oxidized section can be formed continuous across the entire device. This allows deposition of a contact pad (23) on top of the oxidized section of the device, and such contact pad can by far exceed the characteristic size of the aperture (22).

FIG. 3b shows the vertical cross section of this embodiment. The holes (20) and the trench (21) are etched through the top DBR (30). There is a layer (31) which can be oxidized to create sections, which are electrically isolating. The oxidation process starts from the etched holes (20) or trenches (21) and results in the formation of the oxide layer or oxide layers with a certain extension around the holes or trenches (20a, 21a). Some areas are oxidized, others are left non-oxidized (22) which may form a current aperture for the VCSEL. The area below the contact pad (23) is completely oxidized and therefore is forming an electrically isolated volume below the contact pad (23).

FIG. 4 illustrates schematically the device according the same embodiment of FIGS. 3a and 3b in detail. The vertical cavity surface emitting laser (500) is grown epitaxially on the substrate (501). The optical cavity (503) is placed between the bottom distributed Bragg reflector (DBR) (502) and the top DBR (506). The p-n junction (504) is placed in the optical cavity (503). The gain medium (505) is placed in the p-n junction (504). The substrate (501) and the bottom DBR (502) are n-doped. The top DBR (506) is p-doped.

Holes (530) are etched down such that they are etched through the p-n junction (504). Oxidation process starting from the holes results in the formation of the oxide layer (520). A part of this layer (525) remains non-oxidized forming an optical and electrical aperture through which generated light can come out of the device. Due to the oxidation an oxidized section (540) of the device is formed. The key feature of the device (500) is that the oxidized section is continuous (as shown in the top view in FIG. 2a). Thus, a continuous contact area (515) is formed on top of the non-oxidized section (540) of the device (500). Further, a continuous contact pad (512) can be formed on top of the contact area (515).

A section of the device (550) is the non-oxidized section containing the non-oxidized optical aperture (525) through which the generated light (575) is going out.

The key feature of the VCSEL (500) making advantages with respect to the prior art VCSELs is that, first, bottom contact and top contact everywhere in the oxidized section (540) of the device are separated by an oxide layer (520) reducing the capacitance. Second, in the aperture section (non-oxidized section) the bottom contact has no top contact opposite to the bottom contact. Third, the oxidized section is continuous, and a contact area and contact pads can be made of any required size without significant increase in capacitance. Fourth, no large volume of hard dielectric material is used which could otherwise create a source of strong stress. Fifth, no large volume of soft dielectric (like BCB or polyimide) is needed which could otherwise create difficulties with forming top contacts and bonds.

Figure 5:
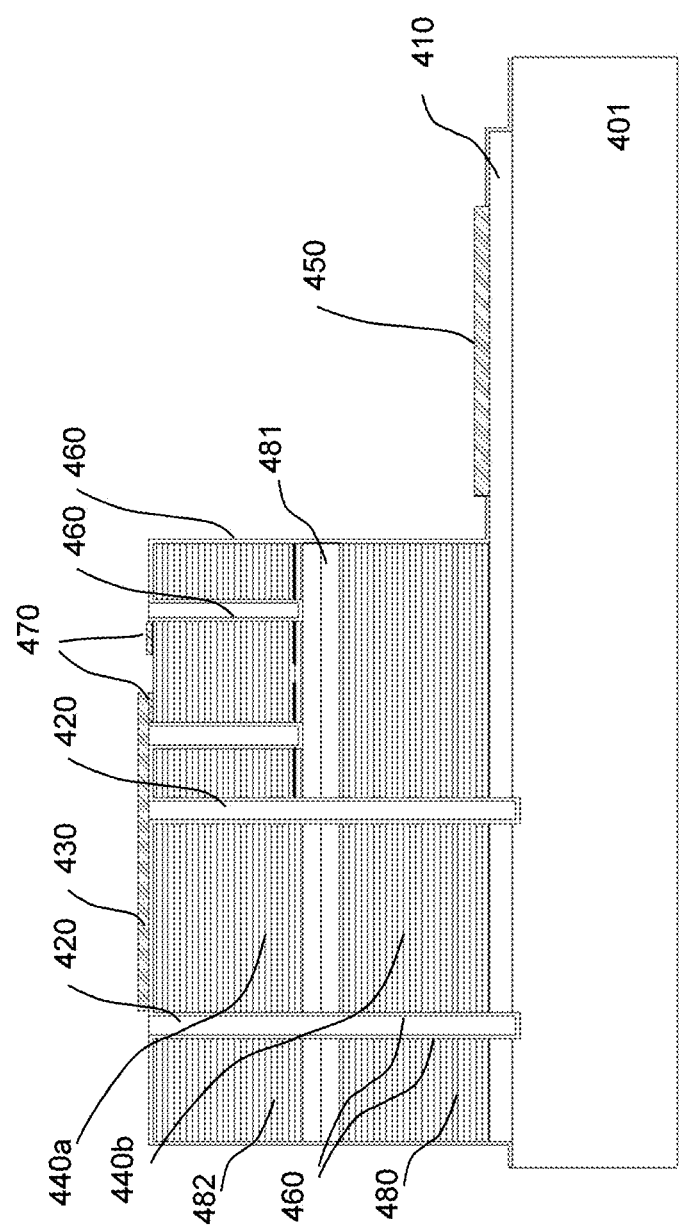
FIG. 5. Schematic vertical cross-section view of another embodiment of the present invention showing deep trenches through the buffer layer to the semi-insulating substrate forming an electrically isolated section of the device.
Figure 6:
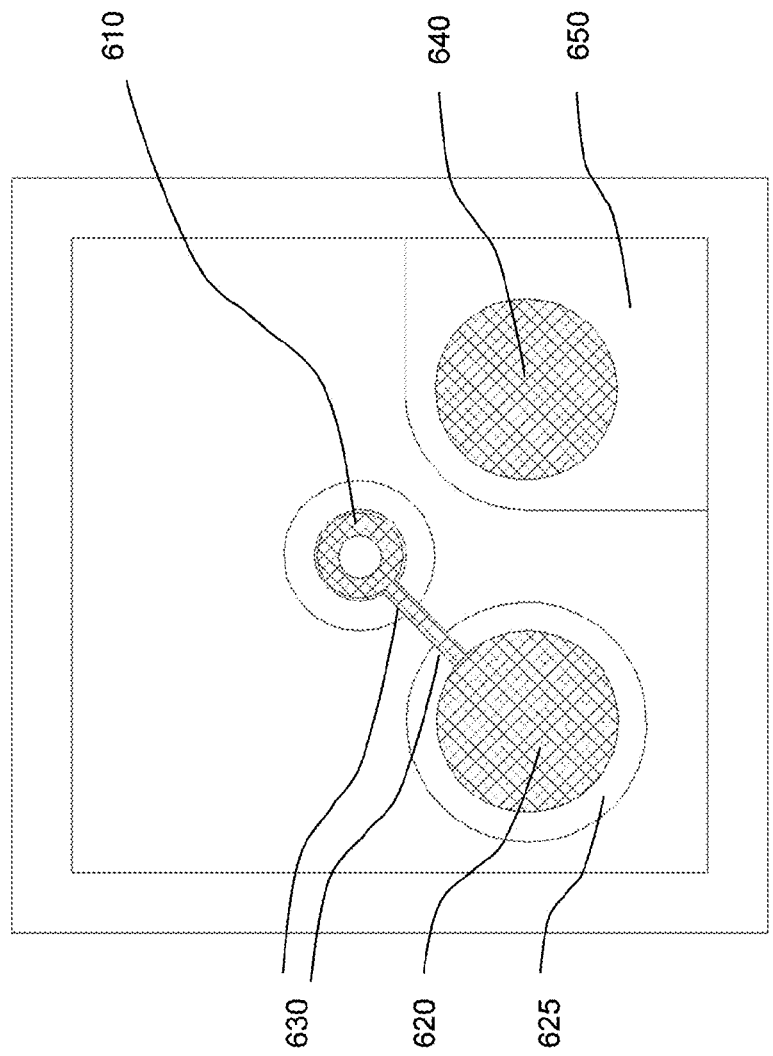
FIG. 6. Schematic top view of the device according to the embodiment of the present invention showing deep trenches around the top contact pad forming an electrically isolated section of the device.

FIGS. 5 and 6 show schematically another embodiment of the present invention. The device is grown epitaxially on a semi-insulating substrate (401). The epitaxial structure begins with a strongly doped buffer layer (410), followed by an n-doped bottom DBR (480), by an undoped optical cavity (481) in which a gain medium is introduced, followed by a top DBR (482). The bottom DBR (480) is preferably n-doped. The optical cavity (481) includes a p-n junction. The top DBR (482) is preferably p-doped. FIG. 4 shows further the deep trenches (420) around the top-pad (430), wherein these trenches are etched even deeper through the buffer layer (410). The trenches are preferably etched also inside the semi-insulating substrate (401) over a distance at least a few hundred nanometers. Thus a section (440a, 440b) of the device is formed which is electrically isolated from the rest of the device. Further, another part of the epitaxial structure is etched down to a buffer layer (410), and on top that surface of the buffer layer is formed the n-contact pad (450).

Further FIG. 5 shows that all trenches are covered by a dielectric for hermetic sealing of the device (460). An opening in the dielectric coverage is formed lithographically on the top surface of the mesa allowing the direct deposition of a top metal contact ring onto the semiconductor (470). An opening in the dielectric coverage is formed on the top surface of the buffer layer (410) allowing deposition of a bottom metal contact (450). The dielectric layer can be formed of $SiO_2$, $Si_xN_y$, or similar dielectric materials.

The key feature of the device in FIG. 5 is that there are now two areas below the top pad contact (430), one of which would be negatively charged (440b) and the other positively charged (440a) opposite to each other. The top contact pad (430) is deposited on the electrically isolated section of the device, and the part of n-doped buffer layer (440b) opposite to the top contact pad is electrically isolated from the bottom n-contact (410). Further, there is no p-doped material or positively charged contacts opposite to the n-contact deposited on the buffer layer. This approach allows obtaining VCSELs having an extremely small capacitance below 500 femto-Farads and even below 300 femto-Farads.

FIG. 6 shows schematically the top view of the device, at which a metal contact ring (610) is deposited on top of the mesa, a large area top contact pad (620) is deposited on top of the electrically isolated section of the device which is isolated electrically from the surrounding by a deep trench (625) which is etched down to the semi-insulating substrate, and an air bridge (630) is made connecting electrically a top contact pad (620) and a top contact metal ring (610). Further, a bottom metal contact (640) is deposited on top of the buffer layer (650).

Figure 7:
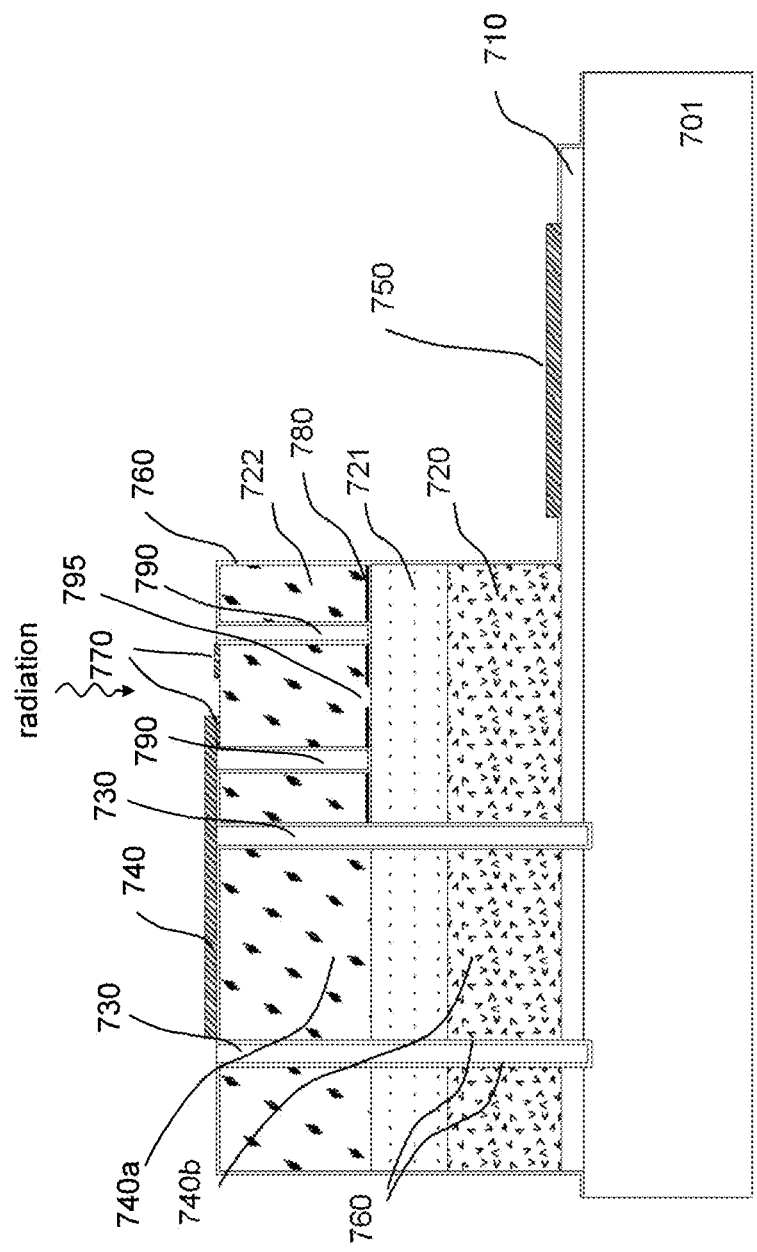
FIG. 7. Schematic vertical cross-section view of the photodiode device according to yet another embodiment of the present invention showing deep trenches through the buffer layer to the semi-insulating substrate forming an electrically isolated section below the top bond pad of the device.

FIG. 7 illustrates a schematic vertical cross section of a photodiode according to yet another embodiment of the present invention. The device is formed on a semi-insulating substrate (701) and consists of an n-doped section (720), an undoped absorption section (721) and a p-doped top section (722) forming the p-n junction of the device. Between the undoped section (721) and the p-doped section (722) a layer is located which can be selectively oxidized (780). The oxidation process starts from the etched holes (790) and results in the formation of the oxide layer or oxide layers with a certain extension around the holes or trenches, leaving some area non-oxidized (795). The non-oxidized area (795) forms an aperture which defines the sensitive area of the photodiode. The metal ring (770) is surrounding this sensitive aperture for the electrical top connection of the photodiode. Further the deep trenches (730) around the top-pad (740) are etched even deeper through the buffer layer (710). The trenches are preferably etched also inside the semi-insulating substrate (701) over a distance of at least a few hundred nanometers. Thus a section (740a, 740b) of the device is formed which is electrically isolated from the rest of the device. Further, another part of the epitaxial structure is etched down to a buffer layer (710) and on top that surface of the buffer layer an n-contact pad (750) is formed.

Further FIG. 7 shows that all trenches are covered by a dielectric for hermetic sealing of the device (760). An opening in the dielectric coverage is made lithographically on the top surface of the mesa allowing the direct deposition of a top metal contact ring to the semiconductor (770). An opening in the dielectric coverage is made on the top surface of the buffer layer (710) allowing deposition of a bottom metal contact (750). The dielectric layer can be formed of $SiO_2$, $Si_xN_y$, or similar dielectric materials.

Figure 8:
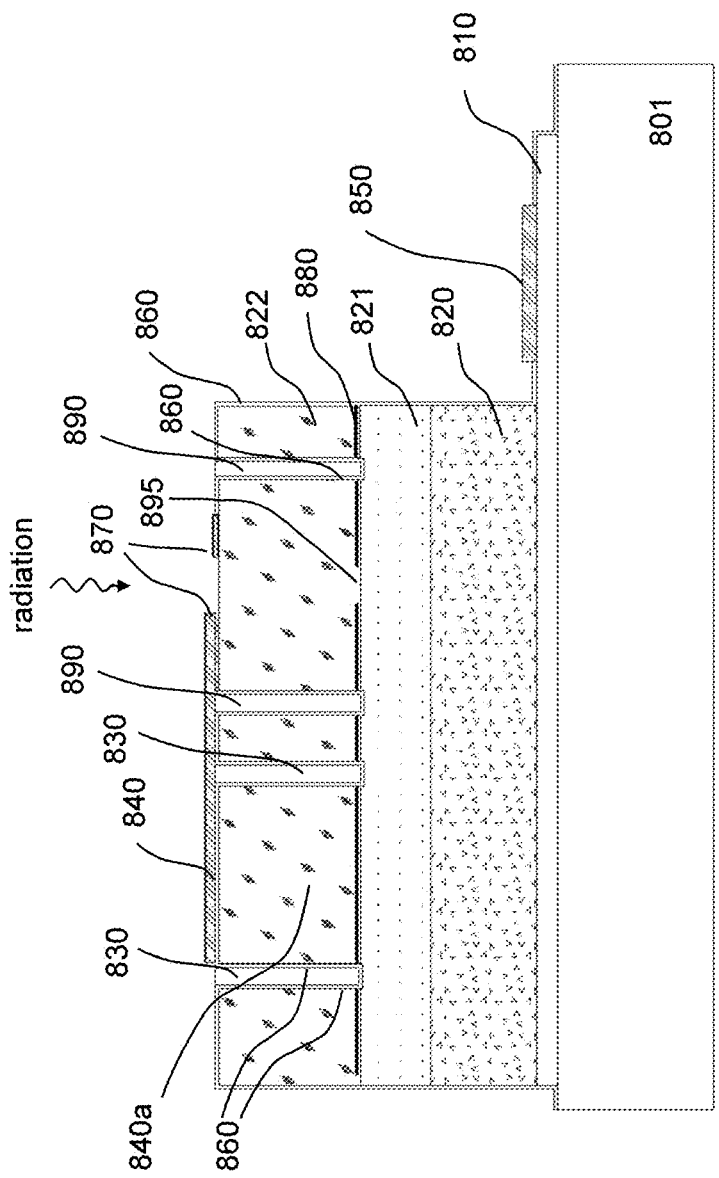
FIG. 8. Schematic vertical cross-section view of a photodiode device according to a further embodiment of the present invention showing, a top metal contact ring on top of the photodiode section, a top contact pad on top of the electrically isolated section which is electrically isolated by an oxidized layer and the air bridge connecting electrically the top contact pad and the top contact ring.

FIG. 8 illustrates a schematic vertical cross section of a photodiode according to a further embodiment of the present invention. It consists of an n-doped section (820), an undoped absorption section (821) and a p-doped top section (822) forming the p-n junction of the device. Between the undoped section (821) and the p-doped section (822) a layer is located which can be selectively oxidized (880). The oxidation process starts from the etched holes (890) or the trench (830) and results in the formation of the oxide layer or oxide layers with a certain extension around the holes or trenches, leaving some area non-oxidized (895). This non-oxidized area (895) may form an aperture which defines the sensitive area of the photodiode. The metal ring (870) is surrounding this sensitive aperture for the electrical top connection of the photodiode. The area (840a) below the bond pad (840) is electrically isolated from the other structures of the device because the layer (880) below the bond pad (840) is completely oxidized.

Further Embodiments of the Present Invention

In yet another embodiment of the present invention, the optoelectronic device is a VCSEL and the gain medium of the VCSEL is placed within the bottom DBR.

In a further embodiment of the present invention, the gain medium is placed in the top DBR.

In another embodiment of the present invention, the gain medium is placed within the bottom DBR, the oxide confined apertures are formed in the bottom DBR, and the optical cavity and the top DBR are formed by deposition of the dielectric materials forming a passive cavity surface-emitting laser.

In yet another embodiment of the present invention, the etched trenches are completely filled by a dielectric material.

In a further embodiment of the present invention, the etched trenches are partially filled by a dielectric material.

In an embodiment of the present invention the trenches are filled with an inorganic dielectric material.

In another embodiment of the present invention the trenches are filled with an organic dielectric material.

In yet another embodiment of the present invention the VCSEL is grown epitaxially on a semi-insulating substrate followed by a p+-doped buffer layer, a p-doped bottom DBR, an undoped optical cavity, and an n-doped top DBR.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. An optoelectronic device having a capacitance below five hundred femto-Farads, comprising
   a) a p-doped section,
   b) a p-n junction,
   c) a n-doped section,
   d) at least one layer aimed for selective oxidation to form an oxide-confined current aperture upon the oxidation,
   wherein said elements a) through d) are vertically arranged on a semi-insulating substrate,
   further comprising
   e) at least one metallic contact area for the electrical connection on top of the device surface,
      wherein the metallic contact area on the device surface is electrically isolated from other areas of the device by applying a trench around the metallic contact area with a depth down into the semi-insulating substrate,
   wherein the at least one metallic contact area on the surface is electrical connected to one of the doped sections with a metal bridge which is crossing the trench.

2. The optoelectronic device of claim 1, wherein said optoelectronic device is a vertical-cavity surface-emitting laser comprising
   a) an optical cavity,
   b) a bottom distributed Bragg reflector positioned on the bottom side of said optical cavity,
   c) a top distributed Bragg reflector positioned on the top side of said optical cavity,
   d) a gain section further comprising a p-n junction,
      wherein said gain section is placed in a position selected from the group consisting of:
         i) position in said bottom distributed Bragg reflector,
         ii) position in said optical cavity, and
         iii) position in said top distributed Bragg reflector,
      wherein the doping of the said bottom distributed Bragg reflector, of said optical cavity, and of said top distributed Bragg reflector is realized by a realization selected from two realizations, in which either
         A) the sections of said bottom distributed Bragg reflector, of said optical cavity, and of said top distributed Bragg reflector, if any, located below said gain section are n-doped, and sections of said bottom distributed Bragg reflector, of said optical cavity, and of said top distributed Bragg reflector, if any, located above said gain section are p-doped, or
         B) the sections of said bottom distributed Bragg reflector, of said optical cavity, and of said top distributed Bragg reflector, if any, located below said gain section are p-doped, and sections of said bottom distributed Bragg reflector, of said optical cavity, and of said top distributed Bragg reflector, if any, located above said gain section are n-doped,
   e) a means of current injection into said gain section,
   f) at least one layer aimed for selective oxidation to form an oxide-confined current aperture upon the oxidation,
      wherein said at least one layer aimed for selective oxidation is introduced into a position selected from the group of positions consisting of
         AA) a position in said top distributed Bragg reflector,
         BB) a position in said optical cavity, and
         CC) a position in said bottom distributed Bragg reflector,
      wherein at least one section of said optoelectronic device termed an oxidized section of said optoelectronic device is formed as a result of the oxidation process,
   g) a contact to said bottom distributed Bragg reflector,
   h) a contact area on top of said top distributed Bragg reflector aimed at current injection into said oxide-confined current aperture,
   i) at least one electrical contact pad to said contact area,
   wherein said contact area comprises at least one section placed on top of said oxidized section of said optoelectronic device, such that an electrical insulator layer between said n-doped distributed Bragg reflector and said p-doped distributed Bragg reflector is formed under said contact pads.

3. The optoelectronic device of claim 1, having a capacitance below three hundred femto-Farads.

4. The optoelectronic device of claim 2, having an aperture diameter below eight micrometer.

5. The optoelectronic device of claim 1, further comprising
   f) at least one first section, and
   g) at least one second section,
   wherein said first section and said second section of said optoelectronic device are separated by a trench etched through said p-n junction.

6. The optoelectronic device of claim 5,
   wherein at least one insulating material is used for at least partial filling of said at least one trench,
   wherein said at least one insulating material is selected from a group consisting of:
      A) an inorganic insulating material, and
      B) an organic insulating material.

7. The optoelectronic device of claim 6,
   wherein said contact pad connects said at least one first section and said at least one second section.

8. The optoelectronic device of claim 2,
   wherein at least one dielectric layer is deposited on top of said top distributed Bragg reflector, and
   wherein said contact pad further comprises at least one section,
      wherein said at least one section of said contact pad is deposited on top of said at least one dielectric layer.

9. The optoelectronic device of claim 6,
   wherein said at least one insulating material further comprises at least one section,
   wherein said at least one section of said at least one insulating material is removed after the deposition of said contact pad.

10. The optoelectronic device of claim 1, wherein the optoelectronic device is a photodiode comprising
- a) a p-doped section,
- b) a p-n junction,
- c) a n-doped section,
- d) at least one layer aimed for selective oxidation to form an oxide-confined current aperture upon the oxidation,
- e) an undoped absorption section, wherein said elements a) through e) are vertically arranged on a semi-insulating substrate, wherein said at least one layer aimed for selective oxidation to form an oxide-confined current aperture upon the oxidation is defining the sensitive area of the photodiode, wherein said at least one layer aimed for selective oxidation is introduced into a position selected from the group of positions consisting of
  - A) a position in said p-doped section,
  - B) a position between said p-doped section and said undoped absorption section,
  - C) a position in said undoped absorption section,
  - D) a position between said undoped absorption section and said n-doped section, and
  - E) a position in said n-doped section.

* * * * *